United States Patent [19]

West et al.

[11] Patent Number: 5,045,432
[45] Date of Patent: Sep. 3, 1991

[54] RADIATION-SENSITIVE COMPOSITION CONTAINING BOTH A POLY(N-ACYLALKYLENEIMINE) AND AN UNSATURATED POLYESTER AND USE THEREOF IN LITHOGRAPHIC PRINTING PLATES

[75] Inventors: Paul R. West, Fort Collins; James E. Mitchell, Windsor; Gary R. Miller, Fort Collins; Paul R. Josephson, Jr., Fort Collins; Raymond W. Ryan, Jr., Fort Collins, all of Colo.

[73] Assignee: Eastman Kodak Company, Rochester, N.Y.

[21] Appl. No.: 554,229

[22] Filed: Jul. 17, 1990

[51] Int. Cl.$^5$ .................... G03C 1/77; G03F 7/038
[52] U.S. Cl. .................... 430/278; 430/285; 430/302; 522/107; 525/42; 525/411
[58] Field of Search .............. 430/302, 278, 906, 908, 430/285; 522/107; 525/42, 411

[56] References Cited

U.S. PATENT DOCUMENTS

| | | | |
|---|---|---|---|
| 3,483,141 | 12/1969 | Litt et al. | 528/402 |
| 3,808,004 | 4/1974 | Thomas et al. | 430/270 |
| 3,929,489 | 12/1975 | Arcesi et al. | 430/278 |
| 4,139,390 | 2/1979 | Rauner et al. | 430/285 |
| 4,173,474 | 11/1979 | Tanaka et al. | 430/306 |
| 4,419,437 | 12/1983 | Noonan et al. | 430/270 |
| 4,606,994 | 8/1986 | Illers et al. | 430/285 |
| 4,696,876 | 9/1987 | Cael | 430/281 |
| 4,725,424 | 1/1984 | Altland et al. | 430/270 |

FOREIGN PATENT DOCUMENTS

| | | |
|---|---|---|
| 722264 | 1/1955 | United Kingdom . |
| 1214462 | 12/1970 | United Kingdom .......... 430/285 |

*Primary Examiner*—Marion E. McCamish
*Assistant Examiner*—Christopher D. RoDee
*Attorney, Agent, or Firm*—Alfred P. Lorenzo

[57] ABSTRACT

Radiation-sensitive compositions which are especially useful in the production of negative-working lithographic printing plates comprise a photocrosslinkable polymer containing the photosensitive group

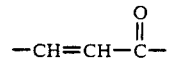

as an integral part of the polymer backbone and, in an amount sufficient to improve the properties of the composition, both a poly(N-acyl-alkyleneimine) and an unsaturated polyester such as a polyester derived from fumaric acid and a 4,4'-isopropylidenediphenol. The combination of a poly(N-acylalkyleneimine) and an unsaturated polyester improves the properties of the radiation-sensitive composition in regard to such factors as shelf life, image contrast, developability, ink receptivity and reduction in mottle and thereby provides a superior lithographic printing plate.

15 Claims, No Drawings

RADIATION-SENSITIVE COMPOSITION CONTAINING BOTH A POLY(N-ACYLALKYLENEIMINE) AND AN UNSATURATED POLYESTER AND USE THEREOF IN LITHOGRAPHIC PRINTING PLATES

FIELD OF THE INVENTION

This invention relates in general to radiation-sensitive compositions and in particular to radiation-sensitive compositions which contain a photocrosslinkable polymer. More specifically, this invention relates to novel radiation-sensitive compositions which are especially useful in the production of lithographic printing plates.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Negative-working lithographic printing plates are prepared from negative-working radiation-sensitive compositions that are formed from polymers which crosslink in radiation-exposed areas. A developing solution is used to remove the unexposed portions of the coating to thereby form a negative image.

The most widely used type of negative-working lithographic printing plate comprises a layer of a radiation-sensitive composition applied to an aluminum substrate and commonly includes a subbing layer or interlayer to control the bonding of the radiation-sensitive layer to the substrate. The aluminum substrate is typically provided with an anodized coating formed by anodically oxidizing the aluminum in an aqueous electrolyte solution.

It is well known to prepare negative-working lithographic printing plates utilizing a radiation-sensitive composition which includes a photocrosslinkable polymer containing the photosensitive group:

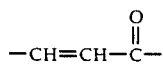

as an integral part of the polymer backbone. (See, for example, U.S. Pat. Nos. 3,030,208, 3,622,320, 3,702,765 and 3,929,489). A typical example of such a photocrosslinkable polymer is the polyester prepared from diethyl p-phenylenediacrylate and 1,4-bis(β-hydroxyethoxy)-cyclohexane, which is comprised of recurring units of the formula:

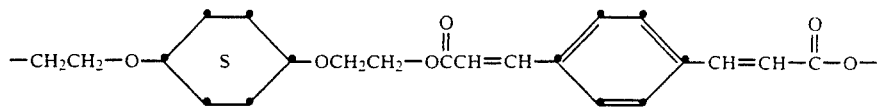

This polyester, referred to hereinafter as Polymer A, has been employed for many years in lithographic printing plates which have been extensively used on a commercial basis. These printing plates have typically employed an anodized aluminum substrate which has been formed by electrolytic anodization with an electrolyte comprised of phosphoric acid.

Polyesters in addition to Polymer A which are especially useful in the preparation of lithographic printing plates are those which incorporate ionic moieties derived from monomers such as dimethyl-3,3'-[(sodioimino)disulfonyl]dibenzoate and dimethyl-5-sodiosulfoisophthalate. Polyesters of this type are well known and are described, for example, in U.S. Pat. No. 3,929,489 issued Dec. 30, 1975. A preferred polyester of this type, referred to hereinafter as Polymer B, is poly[1,4-cyclohexylene-bis(oxyethylene)-p-phenylenediacrylate]-co-3,3'-[(sodioimino)disulfonyl]dibenzoate.

Another preferred polyester of this type, referred to hereinafter as Polymer C, is poly[1,4-cyclohexylene-bis-(oxyethylene)-p-phenylenediacrylate]-co-3,3'-[(sodioimino)disulfonyl]dibenzoate-co-3-hydroxyisophthalate.

While lithographic printing plates prepared from photocrosslinkable polymers such as Polymer A, Polymer B or Polymer C have many advantageous properties, they suffer from certain deficiencies which have limited their commercial acceptance. Thus, for example, shelf-life can be inadequate in that significant scumming in the background areas tends to manifest itself upon aging of the plate without special treatments of the support. As described in Cunningham et al, U.S. Pat. No. 3,860,426, shelf-life is enhanced by overcoating the phosphoric-acid-anodized aluminum substrate with a subbing layer containing a salt of a heavy metal, such as zinc acetate, dispersed in a hydrophilic cellulosic material such as carboxymethylcellulose. As described in European Patent Application No. 0218160, published Apr. 15, 1987, shelf-life can also be enhanced by applying a silicate layer over the anodic layer and then subjecting the silicate layer to a passivating treatment with a salt of a heavy metal, such as zinc acetate.

Omitting the use of such overcoating or passivating treatment of the substrate results in an increasing amount of coating residue on the plate following development as the plate ages, i.e., shelf-life is inadequate. However, the presence of zinc or other heavy metals in the printing plate in extractable form is undesirable because of the potential of contaminating the developer to the point that it can no longer be legally discharged into municipal sewage systems. Moreover, even with zinc acetate passivation or the addition of zinc acetate to a cellulosic subbing layer, the presensitized printing plates exhibit a substantial increase in toe speed on aging which results in undesirably low contrast.

A further disadvantage of the aforesaid photopolymer coatings is that the quantity of coating which can be processed with a given quantity of aqueous developer is less than desirable due to the fact that the coating breaks-up as fairly large particles which tend to redeposit on the imaged areas of the printing plate. The photopolymer coatings can be caused to break-up into finer particles upon development by drying them at higher temperatures than normally used. The use of higher drying temperatures, however, increases manufacturing costs and decreases production efficiency. Furthermore, although the particle sizes are finer, the quantity of photopolymer coating which can be processed before redeposit begins to occur is still less than desirable.

Other disadvantages associated with the use of the aforesaid photopolymers in lithographic printing plates include a tendency for undesirable mottle formation to occur and the need to use an undesirably high concentration of organic solvent in an aqueous-based developing composition. Mottle is particularly affected by the mechanics of film drying, determined by such factors as solvent evaporation rates.

Blinding problems are commonly encountered with commercially available aqueous-developable lithographic printing plates, so that there is an acute need in the art for an additive that is capable of improving ink receptivity.

It is known to incorporate non-light-sensitive, film-forming, resins in radiation-sensitive compositions of the type described hereinabove. For example, U.S. Pat. No. 3,929,489 refers to the use of phenolic resins, epoxy resins, hydrogenated rosin, poly(vinyl acetals), acrylic polymers, poly(alkylene oxides), and poly(vinyl alcohol) and U.S. Pat. No. 4,425,424 specifically discloses the use of polystyrene resin. These resins are employed for such purposes as controlling wear resistance of the coating, improving resistance to etchants and increasing the thickness of the radiation-sensitive layer so as to ensure complete coverage of the relatively rough metal substrate and thereby prevent blinding. However, these resins do not impart beneficial properties with respect to shelf-life or processing characteristics.

It is toward the objective of providing an improved radiation-sensitive composition, useful in the production of lithographic printing plates, that overcomes one or more of the disadvantages described above that the present invention is directed.

SUMMARY OF THE INVENTION

In accordance with this invention, a combination of polymeric additives is incorporated in a radiation-sensitive composition which includes a photocrosslinkable polymer containing the photosensitive group.

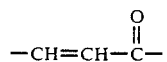

as an integral part of the polymer backbone. The combination of polymeric additives comprises (1) a poly(N-acyl-alkyleneimine) and (2) an unsaturated polyester which is a copolyester of an unsaturated dicarboxylic acid and an oxyalkylene ether of an alkylidene diphenol. This combination improves the properties of the radiation-sensitive composition in regard to such factors as shelf-life, image contrast, developability, ink receptivity and reduction of mottle and thereby provides a superior negative-working lithographic printing plate.

DESCRIPTION OF THE PREFERRED EMBODIMENTS

The following copending commonly assigned U.S. patent applications are directed to inventions which are closely related to that described herein:

(1) U.S. patent application Ser. No. 554,239, filed July 17, 1990, "Radiation-Sensitive Composition Containing a Poly(N-Acyl-Alkyleneimine) and Use Thereof in Lithographic Printing Plates" by Paul R. West et al.

(2) U.S. patent application Ser. No. 554,231, filed July 17, 1990, "Radiation-Sensitive Composition Containing An Unsaturated Polyester and Use Thereof in Lithographic Printing Plates" by Paul R. West et al.

(3) U.S. patent application Ser. No. 554,230, filed July 17, 1990, "Radiation-Sensitive Composition Containing Both a Vinyl Pyrrolidone Polymer and An Unsaturated Polyester and Use Thereof in Lithographic Printing Plates" by Paul R. West et al.

and (4) U.S. patent application Ser. No. 554,232, filed July 17, 1990, "Radiation-Sensitive Composition Containing a Vinyl Pyrrolidone Polymer and Use Thereof in Lithographic Printing Plates" by Paul R. West et al.

As indicated hereinabove, the radiation-sensitive compositions of this invention contain a poly(N-acyl-alkyleneimine).

The poly(N-acyl-alkyleneimines) are well known polymers, some of which are commercially available, and are described in, for example, U.S. Pat. Nos. 3,470,267, 3,483,141, 3,640,909 and 4,474,928. They range in molecular weight from several thousand to several hundred thousand.

The poly(N-acyl-alkyleneimines) utilized in this invention include polymers comprised of repeating units of the formula:

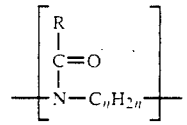

wherein R is a monovalent hydrocarbyl radical containing up to 20 carbon atoms and n is an integer with a value of 2 to 4. The hydrocarbyl radical represented by R can be unsubstituted or substituted with substituents such as halo, haloalkyl, hydroxyalkyl, and the like.

The poly(N-acyl-alkyleneimines) can be prepared by the ring-opening polymerization of heterocyclic monomers of the formula

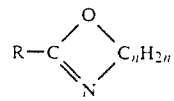

wherein R and n are as defined above. For example, N-acylated polyethyleneimines of the structure

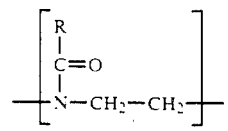

are advantageously prepared from oxazolines of the formula:

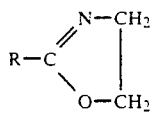

As indicated above, R can be any monovalent hydrocarbyl radical, substituted or unsubstituted, containing up to 20 carbon atoms including alkyl such as ethyl, halogenated alkyl such as dichloroethyl, aryl such as phenyl, halogenated aryl such as p-bromophenyl, aralkyl such as benzyl, cycloalkyl such as cyclohexyl and alkaryl such as tolyl.

Examples of the many different poly(N-acylalkyleneimines) include
poly(N-acetyl ethyleneimine)
poly(N-propionyl ethyleneimine)
poly(N-butyryl ethyleneimine)
poly(N-acetyl trimethyleneimine)
poly(N-propionyl trimethyleneimine)
poly(N-butyryl trimethyleneimine)
poly(N-hexanoyl trimethyleneimine)
poly(N-undecanoyl trimethyleneimine) and the like.

The preferred poly(N-acyl-alkyleneimine) for use in this invention is poly(N-propionyl ethyleneimine). An alternative name for this polymer is poly(2-ethyl-2-oxazoline). It is available from the Dow Chemical Company under the trademark PEOX Polymer, with polymers of different molecular weight available as PEOX 50, PEOX 250 and PEOX 500.

The unsaturated polyester employed in this invention is a copolyester of an unsaturated dicarboxylic acid such as fumaric acid or maleic acid, or mixtures thereof, and an oxyalkylene ether of an alkylidene diphenol. A typical example is the copolyester of fumaric acid which has the formula:

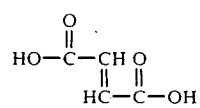

and polyoxypropylene-2,2'-bis(4-hydroxyphenyl)propane which has the formula:

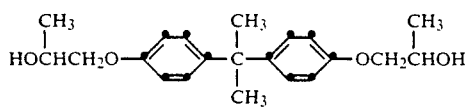

Such copolyesters are well known in the art and are described, for example, in British Patents 722,264, 722,265, 722,266 and 722,273. They are available commercially from Reichhold Chemicals, Inc., as ATLAC 382E BISPHENOL FUMARATE RESIN (also known as ATLAC 32-629-00) and related resins ATLAC 382.05 (a solution of ATLAC 382E in styrene), ATLAC 32-631-00 (also known as ATLAC 382ES), ATLAC 32-628-00 (Also known as ATLAC 382A) and ATLAC 32-630-00 (Also known as ATLAC 382ESA).

To prepare the unsaturated polyester, an alkylene oxide, such as propylene oxide, is condensed with an alkylidene diphenol such as bisphenol-A, to give the bis-hydroxyalkyl derivative which, in turn, is reacted with an unsaturated acid, such as fumaric acid, to give the unsaturated polyester.

As described in British Patent No. 722,264, the suitable oxyalkylene ethers of an alkylidene diphenol can be generically represented by the formula:

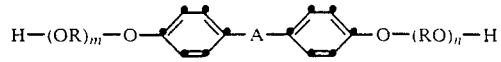

wherein A is a 2-alkylidene radical of 3 or 4 carbon atoms, R is an alkylene radical of 2 or 3 carbon atoms, m and n are each at least one and the sum of m and n is not greater than 3. The esterifying dicarboxylic acid is predominantly fumaric acid, or maleic acid or mixtures thereof, but may include minor proportions of saturated aliphatic acids, aromatic acids or other unsaturated aliphatic acids, such as, for example, succinic acid, sebacic acid, phthalic acid or itaconic acid.

Each of the poly(N-acyl-alkyleneimine) and the copolyester of an unsaturated dicarboxylic acid and an oxyalkylene ether of an alkylidene diphenol is typically incorporated in the radiation-sensitive composition in an amount of from about 2 to about 30 percent by weight based on total polymer content, and more particularly in an amount of from about 5 to about 15 percent by weight.

Copolyesters of an unsaturated carboxylic acid and an oxyalkylene ether of an alkylidene diphenol have been found to be especially useful in controlling the break-up of the photopolymer coatings in aqueous developing solutions. Specifically, the presence of the copolyester results in finer particle sizes upon processing of such coatings with aqueous developers. The copolyester additive is less prone than other polymeric additives to extraction from crosslinked portions of photopolymer coatings upon processing. It has also been found to improve the rate of initial ink-up of printing plates and to counteract the blinding tendencies caused by addition of the poly(N-acyl-alkyleneimine) to the photopolymer coating. (The term "blinding" refers to rendering the image area non-ink-receptive.)

The radiation-sensitive compositions of this invention comprise photocrosslinkable polymers, such as polyesters, containing the photosensitive group

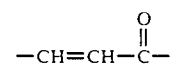

as an integral part of the polymer backbone. For example, preferred photocrosslinkable polymers are polyesters prepared from one or more compounds represented by the following formulae:

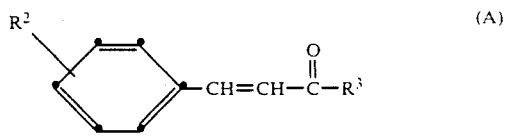

where $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosures of which are incorporated herein by reference.

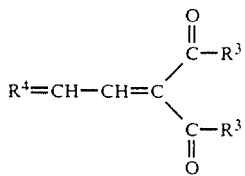
(B)

$R^3$ is as defined above, and $R^4$ is alkylidene of 1 to 4 carbon atoms, aralkylidene of 7 to 16 carbon atoms, or a 5- to 6-membered heterocyclic ring. Particularly useful compounds of formula (B) are cinnamylidenemalonic acid, 2-butenylidenemalonic acid, 3-pentenylidenemalonic acid, o-nitro-cinnamylidene malonic acid, naphthylallyl-idenemalonic acid, 2-furfurylideneethylidenemalonic acid and functional equivalents thereof. These and other useful compounds are described in U.S. Pat. No. 3,674,745 (issued July 4, 1972 to Philipot et al), the disclosure of which is incorporated herein by reference.

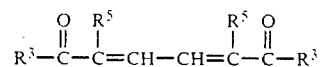
(C)

$R^3$ is as defined above; and $R^5$ is hydrogen or methyl. Particularly useful compounds of formula (C) are trans, trans-muconic acid, cis-transmuconic acid, cis, cis-muconic acid, $\alpha,\alpha'$-cis, trans-dimethylmuconic acid, $\alpha,\alpha'$-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

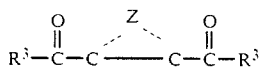
(D)

$R^3$ is as defined above; and Z represents the atoms necessary to form an unsaturated bridged or unbridged carbocyclic nucleus of 6 or 7 carbon atoms. Such nucleus can be substituted or unsubstituted. Particularly useful compounds of formula (D) are 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Patent No. 824,096 (issued Sept. 30, 1969 to Mench et al), the disclosure of which is incorporated herein by reference.

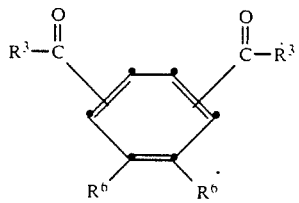
(E)

$R^3$ is as defined above; and $R^6$ is hydrogen, alkyl 1 to 12 carbon atoms, cycloalkyl of 5 to 12 carbon atoms or aryl of 6 to 12 carbon atoms. $R^6$ can be substituted where possible, with such substituents as do not interfere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclohexadiene-1,4-dicarboxylic acid, 1,3-cyclohexadiene-1,3-dicarboxylic acid, 1,5-cyclohexadiene-1,4-dicarboxylic acid and functional equivalents thereof. These and other useful compounds are described in Belgian Patent No. 754,892 (issued Oct. 15, 1970), the disclosure of which is incorporated herein by reference.

Preferred photocrosslinkable polyesters for use in this invention are p-phenylene diacrylate polyesters.

Printing plates of this invention comprise a support having coated thereon a layer containing the radiation-sensitive composition described above. Such plates can be prepared by forming coatings with the coating composition and removing the solvent by drying at ambient or elevated temperatures. Any one of a variety of conventional coating techniques can be employed, such as extrusion coating, doctor-blade coating, spray coating, dip coating, whirl coating, spin coating, roller coating, etc.

Coating compositions containing the mixture of polymers of this invention can be prepared by dispersing or dissolving the polymers in any suitable solvent or combination of solvents used in the art to prepare polymer dopes. The solvents are chosen to be substantially unreactive toward the polymers within the time period contemplated for maintaining the solvent and polymer in association and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cyclohexanone; ethers, such as tetrahydrofuran and dioxane; 2-methoxyethyl acetate; N,N'-dimethyformamide; chlorinated hydrocarbons such as chloroform, trichloroethane, 1,2-dichloroethane, 1,1-dichloroethane, 1,1,2-trichloroethane, dichloromethane, tetrachloroethane, chlorobenzene; and mixtures thereof.

Suitable supports can be chosen from among a variety of materials which do not directly chemically react with the coating composition. Such supports include fiber based materials such as paper, polyethylene-coated paper, polypropylene-coated paper, parchment, cloth, etc.; sheets and foils of such materials as aluminum, copper, magnesium zinc, etc.; glass and glass coated with such metals as chromium alloys, steel, silver, gold, platinum, etc.; synthetic resin and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Preferred support materials include zinc, anodized aluminum, grained aluminum, and aluminum which has been grained and anodized. Particularly preferred support materials are described in Miller et al, U.S. Pat. No. 4,647,346, issued Mar. 3, 1987, and Huddleston et al, U.S. Pat. No. 4,865,951, issued Sept. 12, 1989.

The support can be preliminarily coated—i.e., before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc.; carboxymethyl cellulose, gelatin; polyacrylamide; and similar polymer materials. A preferred subbing composition comprises benzoic acid and is described in Miller et al, U.S. Pat. No. 4,640,886, issued Feb. 3, 1987.

The optimum coating thickness of the radiation-sensitive layer will depend upon such factors as the particular application to which the printing plate will be put, and the nature of other components which may be present in the coating. Typical coating thicknesses can be from about 0.05 to about 10.0 microns or greater, with thicknesses of from 0.1 to 2.5 microns being preferred.

The printing plate of this invention can be exposed by conventional methods, for example, through a transparency or a stencil, to an imagewise pattern of actinic radiation, preferably rich in ultraviolet light, which crosslinks and insolubilizes the radiation-sensitive polymer in the exposed areas. Suitable light sources include carbon arc lamps, mercury vapor lamps, fluorescent lamps, tungsten filament lamps, "photoflood" lamps, lasers and the like. The exposure can be by contact printing techniques, by lens projection, by reflex, by bireflex, from an image-bearing original or by any other known technique.

The exposed printing plate of this invention can be developed by flushing, soaking, swabbing or otherwise treating the radiation-sensitive composition with a solution (hereinafter referred to as a developer) which selectively solubilizes (i.e., removes) the unexposed areas of the radiation-sensitive layer. The developer is preferably an aqueous alkaline solution having a pH as near to neutral as is feasible.

In a preferred form, the developer includes a combination of water and an alcohol that is miscible with water, or able to be rendered miscible by the use of cosolvents or surfactants, as a solvent system. The proportions of water and alcohol can be varied widely but are typically within the range of from 40 to 99 percent by volume water and from 1 to 60 percent by volume alcohol. Most preferably, the water content is maintained within the range of from 60 to 90 percent by volume. Any alcohol or combination of alcohols that does not chemically adversely attack the crosslinked radiation-sensitive layer during development and that is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols—i.e., dihydroxy poly(alkylene oxides)—e.g., dihydroxy poly(ethylene oxide), dihydroxy poly(propylene oxide), etc.

It is recognized that the developer can, optionally, contain additional addenda. For example, the developer can contain dyes and/or pigments. It can be advantageous to incorporate into the developer anti-scumming and/or anti-blinding agents as is well recognized in the art.

A preferred developing composition for use with the novel lithographic printing plates of this invention is an aqueous composition including:

(a) a nontoxic developing vehicle, such as butyrolactone, phenoxy propanol, phenoxy ethanol, benzyl alcohol or methyl pyrrolidone, which is a non-solvent for any of the components of the lithographic plate;

(b) a first surfactant comprising a sodium, lithium or potassium salt of xylene sulfonic acid;

(c) a second surfactant comprising a sodium, lithium or potassium salt of toluene, ethyl benzene, cumene or mesitylene sulfonic acid;

(d) a third surfactant comprising a sodium, lithium or potassium salt of an alkyl benzene sulfonic acid, the alkyl group containing at least ten carbon atoms, or an alkyl naphthalene sulfonic acid, the alkyl group containing from one to four carbon atoms;

(e) a cold water soluble film-forming agent such as polyvinyl pyrrolidone, polystyrene/maleic anhydride copolymers, polyvinyl alcohol, polyvinyl methyl ethers and polystyrene/vinyl acetate copolymers;

(f) an alkanolamine desensitizing agent such as diethanolamine; and (g) an acid, such as citric, ascorbic, tartaric, glutaric, acetic, phosphoric, sulfuric or hydrochloric acid, to control the pH of the developing composition.

These developing compositions are described in copending commonly assigned U.S. Pat. application Ser. No. 379,823, filed July 14, 1989, "Aqueous Developer Composition For Developing Negative-Working Lithographic Printing Plates", by J. E. Walls, the disclosure of which is incorporated herein by reference. A developing composition of this type is commercially available from Eastman Kodak Company, Rochester, N.Y., as KODAK AQUEOUS PLATE DEVELOPER MX-1469-1.

After development, the printing plate can be treated in any known manner consistent with its intended use. For example, lithographic printing plates are typically subjected to desensitizing etches.

In addition to the photocrosslinkable polymer, the poly(N-acyl-alkyleneimine) and the copolyester of an unsaturated dicarboxylic acid and an oxyalkylene ether of an alkylidene diphenol, a number of other addenda can be present in the coating composition and ultimately form a part of the completed printing plate. For example, radiation sensitivity of the radiation-sensitive polymeric composition can be enhanced by incorporating therein one or more spectral sensitizers. Suitable spectral sensitizers include anthrones, nitro sensitizers, triphenylmethanes, quinones, cyanine dyes, naphthones, pyrylium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Preferred sensitizers include the 3-ketocoumarins described in U.S. Pat. No. 4,147,552 and the thiazoline sensitizers of U.S. Pat. No. 4,062,686. Such sensitizers can be present in the compositions in effective sensitizing amounts easily determined by one of the ordinary skill in the art.

The coating composition can contain pigments preferably having a maximum average particle size less than about 3 micrometers. These pigments can provide a visible coloration to an image before or after development of the element. Useful pigments are well known in the art and include titanium dioxide, zinc oxide, copper phthalocyanines, halogenated copper phthalocyanines, quinacridine, and colorants such as those sold commercially under such trade names as Monastral Blue and Monastral Red B. The pigments are generally present in the compositions in an amount within the range of from 0 to about 50 percent (by weight) based on the total dry composition weight. Preferred amounts are within the range of from about 5 to about 20 percent (by weight).

It is frequently desirable to add print out or indicator dyes to the compositions to provide a colored print out image after exposure. Useful dyes for such purpose include monoazo, diazo, methine, anthraquinone, triarylmethane, thiazine, xanthene, phthalocyanine, azine, cyanine and leuco dyes as described, for example, in U.S. Pat. Nos. 3,929,489 and 4,139,390 and references noted therein. Such dyes are present in amounts readily determined by a person of ordinary skill in the art.

It is recognized that the radiation-sensitive composition of this invention can become crosslinked prior to intended exposure if the compositions or printing plates of this invention are stored at elevated temperatures, in areas permitting exposure to some quantity of actinic radiation and/or for extended periods of time. To insure against crosslinking the composition inadvertently before intended exposure to actinic radiation, stabilizers can be incorporated into the radiation-sensitive compositions and printing plates of this invention. Useful stabilizers include picoline N-oxide; phenols, such as 2,6-di-tert-butyl-p-cresol, 2,6-di-tert-butylanisole and p-methoxyphenol; hydroquinones such as hydroquinone, phloroglucinol and 2,5-di-tert-butylhydroquinone; triphenylmetallics, such as triphenylarsine; triphenylstilbene; and tertiary amines, such as N-methyldephenylamine.

Still other addenda useful in the printing plates of this invention include antioxidants, surfactants, anti-scumming agents, and others known in the art.

Binders or extenders can optionally be incorporated into the radiation-sensitive composition. Such binders or extenders can be present in an amount within the range of from 0 to about 50 percent (by weight) based on total dry composition weight. Suitable binders include styrene-butadiene copolymers; silicone resins; styrene-alkyd resins; silicone-alkyd resins; soya-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); poly-acrylic and -methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-co-alkaryloxy-alkylene terephthalate); phenolformaldehyde resins; ketone resins; polyamides; polycarbonates; polythiocarbonates, poly(ethylene 4,4'-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin. Methods of making binders or extenders of this type are well known in the prior art. A typical resin of the type contemplated for use is Piccolastic A50 TM, commercially available from Hercules, Inc., Wilmington, Del. Other types of binders which can be used include such materials as paraffin and mineral waxes.

The invention is further illustrated by the following examples of its practice.

EXAMPLE 1

Coating compositions useful in preparing lithographic printing plates were prepared in accordance with the following formulations:

| Component | Amounts (grams) | | |
|---|---|---|---|
| | Composition 1 | Composition 2 | Composition 3 |
| (1) Polymer A (15% by weight solution in 1,2-dichloroethane) | 144.16 | | |
| (2) Polymer B (15% by weight solution in 1,2-dichloroethane) | | 144.15 | |
| (3) Polymer C (15% by weight solution in 1,2-dichloroethane) | | | 144.15 |
| (4) MONASTRAL Red pigment (7% by weight dispersion in 1,2-dichloroethane) | 52.13 | 51.54 | |
| (5) MONASTRAL Blue pigment (7% by weight dispersion in 1,2-dichloroethane) | | | 18.49 |
| (6) 2-[Bis(2-furoyl)methylene]-1-methyl-naphtho[1,2-d]thiazoline | 0.63 | | 0.83 |
| (7) 3,3'-Carbonylbis(5,7-di-n-propoxycoumarin) | | 1.03 | |
| (8) 2,6-Di-t-butyl-p-cresol | 0.60 | 0.68 | 0.60 |
| (9) N-(4-Chlorobenzenesulfonyloxy)-1,8-naphthalimide | 1.77 | 1.14 | 1.42 |
| (10) Dihydroanhydropiperidinohexose reductone | 0.08 | 0.02 | 0.03 |
| (11) Leuco propyl violet | 0.46 | 0.28 | 0.27 |
| (12) MODAFLOW coating aid* | 0.02 | | |
| (13) FC-430 surfactant** | | 0.15 | 0.23 |
| (14) 1,2-Dichloroethane | 597.06 | 597.06 | 630.90 |

*MODAFLOW coating aid is a copolymer of ethylacrylate and 2-ethylhexyl acrylate manufactured by Monsanto Corporation.
**FC-430 surfactant is a mixture of fluoroaliphatic polymeric esters manufactured by Minnesota Mining and Manufacturing Company.

In the above formulations, (1), (2), and (3) serve as film-forming polymers, (4) and (5) serve as colorants, (6) and (7) serve as spectral sensitizers, (8) serves as a stabilizer, (9) serves at a photooxidant, (10) serves as an antioxidant, (11) serves as a print-out dye, (12) and (13) serve as coating aids and (14) serves as a solvent.

A comparison coating was prepared by incorporating polystyrene resin (available under the trademark Piccolastic A-50 from Hercules, Inc.) in the formulation of Composition 1 in an amount of 15.3% of the total polymer content. A composition within the scope of the present invention was prepared by incorporating, in the formulation of Composition 1, ATLAC 382E in an amount of 11% of the total polymer content and PEOX 50 in an amount of 7% of the total polymer content.

Each composition was used to prepare a lithographic printing plate by coating it over a brush-grained, phosphoric acid-anodized aluminum substrate provided with a thin carboxymethyl cellulose subcoat. Each coating was imaged and then processed with Kodak Aqueous Plate Developer MX-1469-1, available from Eastman Kodak Company, Rochester, N.Y. The plates were mounted on a printing press, and the number of impressions required to produce an acceptable print under the test conditions was then determined for each plate under normal conditions as well as after treatment with a commercial plate cleaner. The results obtained are indicated in Table I below.

TABLE I

| Test No. | Additive (Wt. %) | Coating Weight (g/m$^2$) | Number of Impressions | |
|---|---|---|---|---|
| | | | Initial Roll-up | After Cleaning |
| Control A | none | 0.84 | 16 | 100 |
| Control B | Piccolastic A-50 (15.3) | 0.88 | 12 | 100 |
| Control C | Piccolastic A-50 (15.3) | 1.33 | 5 | 22 |
| Example 1 | ATLAC 382E/PEOX 50 (11/7) | 0.81 | 2 | 7 |

It is desirable to have plates roll-up to full ink density with a minimum number of impressions to reduce paper waste as well as to improve press efficiency. A good printing plate can generally be expected to produce acceptable prints in less than 10 impressions. Control A demonstrates that brush-grained plates with coating weights of less than about 1 g/m$^2$ are slow to roll-up to full ink density. Polystyrene is a very oleophilic polymer, but it offers only a modest improvement in the roll-up rates at low coverage, as evidenced by Control B. It was unexpected, therefore, to find that the coating containing both the ATLAC and PEOX resins produced excellent rollth the ATLAC and PEOX resins produced excellent roll-up rates even at low total coating weights, as shown in Example 1.

Other additives such as polystyrene can give excellent roll-up characteristics if the coating weight is sufficiently high, but such coatings can still be susceptible to blinding caused by typical press treatments. Control C demostrates that a commercial plate cleaner applied to a plate that otherwise rolls up quickly can produce unacceptably slow roll-up rates. The coating with the ATLAC and PEOX resin additives of Example 1 showed excellent roll-up behavior even after the plate cleaner treatment, despite the fact that the coating weight was quite low.

EXAMPLE 2

Coatings similar to those in Example 1 were prepared using the formulations of Compositions 2 and 3 to which had been added 7.4% of PEOX 50 and 11.1% of ATLAC 382E. The coatings were similarly processed and tested for their ink receptivity. Satisfactory prints were obtained after only 6 impressions for Composition 2 and after only 7 impressions for Composition 3.

EXAMPLE 3

A machine processor charged with 19 liters of Kodak Aqueous Plate Developer MX-1469-1 was "seasoned" by processing 280 m$^2$ of plate bearing the coating identified as Control C in Example 1. At this point, plates bearing the coatings identified as Control A and Control B as well as the Example 1 coating were imaged and processed with the "seasoned" developer. The unexposed portions of Control coatings A and B partially transferred to the entrance roller of the machine processor and subsequently deposited onto the plate. The portions which did not transfer onto the entrance roller agglomerated in the aqueous developer and deposited onto the imaged areas. The resulting plates could not be used to produce acceptable prints. In contrast, the plate with Example 1 coating processed clearly, with no transfer to the entrance roller or redeposit onto the imaged areas.

The poly(N-acyl-alkyleneimines) are both solvent soluble and water soluble. These solubility characteristics render them especially advantageous for use in the present invention since they facilitate both coating from solvent solution to form the radiation-sensitive layer and subsequent development by the use of "aqueous" developing solutions, i.e., developing solutions which are predominantly water but do contain small amounts of organic solvent. Incorporation of the poly(N-acyl-alkyleneimine) in the radiation-sensitive composition permits the use of lower concentrations of organic solvent in the aqueous developing solution, as compared with an otherwise identical composition that does not contain the poly(N-acyl-alkyleneimine). Also, significantly less mottle results when the poly(N-acyl-alkyleneimine) is employed and higher contrast images are achieved. Addition of the copolyester of an unsaturated dicarboxylic acid and an oxyalkylene ether of an alkylidene diphenol provides still further improvements. Thus, for example, it causes the coating to breakup into finer particle sizes and it improves the rate of initial ink-up.

The most important benefits obtained from use of a copolyester of an unsaturated dicarboxylic acid and an oxyalkylene ether of an alkylidene diphenol, as described herein, are improved roll-up and decreased sensitivity to blinding. Coatings containing these copolyesters are less susceptible to the effects of varying coverage on roll-up. They roll-up quicker in general, especially in comparison between plates which have been stored for several days or more before going to press.

Current trends in the lithographic printing plate industry favor the use of "aqueous developers." By this is meant that the developer used to process the printing plate, either by hand or by machine, contains little or no organic solvent and that any organic solvent which is present is nontoxic and a high boiling material with a very low vapor pressure. Other ingredients included in the developer, such as salts and surfactants, are nontoxic and biodegradable. The present invention is especially well adapted, by virtue of the polymeric materials incorporated in the radiation-sensitive composition, for use with such "aqueous developers."

The invention has been described in detail with particular reference to preferred embodiments thereof, but it will be understood that variations and modifications can be effected within the spirit and scope of the invention.

We claim:

1. A negative-working lithographic printing plate comprising a support having thereon a radiation-sensitive layer of a composition comprising a mixture of (A) a photocrosslinkable p-phenylene diacrylate polyester containing the photosensitive group

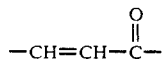

as an integral part of the polymer backbone, (B) a poly(N-acyl-alkyleneimine) and (C) a copolyester of an unsaturated dicarboxylic acid and an oxyalkylene ether of an alkylidene diphenol.

2. A negative-working lithographic printing plate as claimed in claim 1, wherein said support is an anodized aluminum support.

3. A negative-working lithographic printing plate as claimed in claim 2, including a subbing layer between said anodized aluminum support and said radiation-sensitive layer.

4. A negative-working lithographic printing plate as claimed in claim 2, wherein said poly(N-acyl-alkyleneimine) is comprised of repeating units of the formula

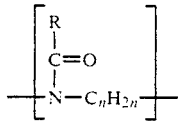

wherein R is a monovalent hydrocarbyl radical containing up to 20 carbon atoms and n is an integer with a value of 2 to 4.

5. A negative-working lithographic printing late as claimed in claim 2, wherein said poly(N-acyl-alkyleneimine) is an N-acylated polyethyleneimine.

6. A negative-working lithographic printing plate as claimed in claim 2, wherein said poly(N-acyl-alkyleneimine) is poly(2-ethyl-2-oxazoline).

7. A negative-working lithographic printing plate as claimed in claim 2, wherein said unsaturated dicarboxylic acid is selected from the group consisting of fumaric acid, maleic acid and mixtures thereof.

8. A negative-working lithographic printing plate as claimed in claim 2, wherein said copolyester is a copolyester of fumaric acid and an oxyalkylene ether of an alkylidene diphenol of the formula:

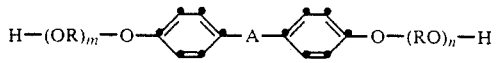

wherein A is a 2-alkylidene radical of 3 or 4 carbon atoms, R is an alkylene radical of 2 or 3 carbon atoms, m and n are each at least one and the sum of m and n is not greater than 3.

9. A negative-working lithographic printing plate as claimed in claim 2, wherein said copolyester is a copolyester of fumaric acid and polyoxypropylene-2,2'-bis(4-hydroxyphenyl)propane.

10. A negative-working lithographic printing plate as claimed in claim 2, wherein each of said poly(N-acyl-alkyleneimine) and said copolyester is present in said radiation-sensitive layer in an amount of from about 2 to about 30 percent by weight based on total polymer content.

11. A negative-working lithographic printing plate as claimed in claim 2, wherein each of said poly(N-acyl-alkyleneimine) and said copolyester is present in said radiation-sensitive layer in an amount of from about 5 to about 15 percent by weight based on total polymer content.

12. A negative-working lithographic printing plate comprising an anodized aluminum support having thereon a radiation-sensitive layer of a composition comprising a mixture of (A) a photocrosslinkable polymer comprised of recurring units of the formula:

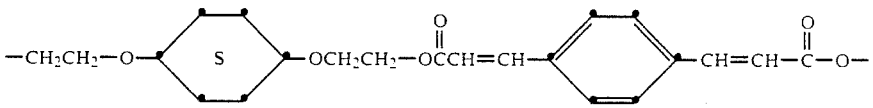

(B) poly(2-ethyl-2-oxazoline) and (C) a copolyester of fumaric acid and polyoxypropylene-2,2'-bis-(4-hydroxyphenyl)propane.

13. A negative-working lithographic printing plate comprising an anodized aluminum support having thereon a radiation-sensitive layer of a composition comprising a mixture of (A) poly[1,4-cyclohexylene-bis(oxyethylene)-p-phenylene diacrylate]-co-3,3'-[(sodioimino)disulfonyl]dibenzoate, (B) poly(2-ethyl-2-oxazoline) and (C) a copolyester of fumaric acid and polyoxypropylene-2,2'-bis-(4-hydroxyphenyl)propane.

14. A negative-working lithographic printing plate comprising an anodized aluminum support having thereon a radiation-sensitive layer of a composition comprising a mixture of (A) poly[1,4-cyclohexylene-bis(oxyethylene)-p-phenylenediacrylate]-co-3,3'-[(sodioimino)disulfonyl]dibenzoate-co-3-hydroxyisophthalate, (B) poly(2-ethyl-2-oxazoline) and (C) a copolyester of fumaric acid and polyoxypropylene-2,2'-bis-(4-hydroxyphenyl)propane.

15. A negative-working lithographic printing plate comprising a support having thereon a radiation-sensitive layer of a composition comprising a mixture of (A) a photocrosslinkable p-phenylene diacrylate polyester containing the photosensitive group:

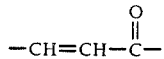

as an integral part of the polymer backbone, (B) a poly(N-acyl-alkyleneimine) and (C) a copolyester of an unsaturated dicarboxylic acid, selected from the group consisting of fumaric acid, maleic acid and mixtures thereof, and an oxyalkylene ether of an alkylidene diphenol.

* * * * *